United States Patent
Feldhaus et al.

(10) Patent No.: US 10,771,076 B1
(45) Date of Patent: Sep. 8, 2020

(54) MEASURING DEVICE, CALIBRATION METHOD AND MEASURING METHOD WITH JITTER COMPENSATION

(71) Applicant: Rohde & Schwarz GmbH & Co. KG, Munich (DE)

(72) Inventors: Gregor Feldhaus, Munich (DE); Alexander Roth, Dorfen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/366,627

(22) Filed: Mar. 27, 2019

(51) Int. Cl.
| | | |
|---|---|---|
| H03M 1/06 | (2006.01) | |
| H03M 1/08 | (2006.01) | |
| H04L 7/033 | (2006.01) | |
| H03M 1/12 | (2006.01) | |

(52) U.S. Cl.
CPC ....... *H03M 1/0836* (2013.01); *H03M 1/1245* (2013.01); *H04L 7/033* (2013.01)

(58) Field of Classification Search
CPC .... H03M 1/0836; H03M 1/1245; H03M 1/06; H03M 1/1023; H04L 7/033
USPC .......................................... 341/118, 119, 120
See application file for complete search history.

(56) References Cited

U.S. PATENT DOCUMENTS

| | | | | |
|---|---|---|---|---|
| 3,800,228 A | | 3/1974 | Acker | |
| 7,498,858 B2* | | 3/2009 | Desai ...................... | H04L 7/033 327/246 |
| 7,609,758 B2* | | 10/2009 | Jungerman ............. | H04L 1/205 375/226 |
| 7,825,708 B2* | | 11/2010 | Thomsen ................ | H03L 1/022 327/147 |
| 7,890,788 B2* | | 2/2011 | Yin .......................... | H03L 7/06 713/500 |
| 8,537,955 B1* | | 9/2013 | Keane .................... | H03L 7/0807 327/156 |
| 8,650,429 B1* | | 2/2014 | Starr ................ | H03K 19/01837 713/400 |
| 9,101,009 B2* | | 8/2015 | Osterried ........... | H05B 33/0806 |
| 9,203,418 B2* | | 12/2015 | Mohajeri .............. | H03L 7/1075 |
| 2003/0056157 A1* | | 3/2003 | Fala ........................ | H03L 7/085 714/700 |
| 2014/0140189 A1 | | 5/2014 | Shattil | |

FOREIGN PATENT DOCUMENTS

| | | |
|---|---|---|
| BR | 9502503 A | 12/1995 |
| JP | S62219205 A | 9/1987 |
| NL | 7302394 A | 8/1973 |
| SE | 8503057 L | 12/1985 |

OTHER PUBLICATIONS

Syrjälä et al., "Sampling Jitter Cancellation in Direct-Sampling Radio", published in 2010 IEEE Wireless Communication and Networking Conference, dated Jul. 8, 2010, 6 pages.

* cited by examiner

*Primary Examiner* — Jean B Jeanglaude
(74) *Attorney, Agent, or Firm* — Ditthavong & Steiner P.C.

(57) ABSTRACT

A measuring device with jitter compensation is provided. The measuring device including at least one analog-to-digital converter, a clock source, and at least one phase shifter. In this context, the at least one phase shifter is configured to receive a clock signal from the clock source and to adjust the respective phase.

20 Claims, 10 Drawing Sheets

MEASURING DEVICE, CALIBRATION METHOD AND MEASURING METHOD WITH JITTER COMPENSATION

TECHNICAL FIELD

The invention relates to a measuring device with jitter compensation, a corresponding calibration method therefor, and a measuring method with jitter compensation.

BACKGROUND ART

Generally, in times of an increasing number of applications employing circuitry, there is a growing need of a measuring device, a corresponding calibration method therefor, and a measuring method for performing measurements with respect to a device under test comprising such an application in order to verify correct functioning of said applications in a highly accurate and efficient manner, whereby jitter is especially compensated.

The document "Sampling Jitter Cancellation in Direct-Sampling Radios" by Ville Syrjälä and Mikko Valkama published in IEEE Communications Society, WCNC 2010 proceedings, discloses a method to compensate for a timing jitter in the digital domain. Said method uses a pilot tone, which is superimposed to the respective analog-to-digital input and lies outside of the useful data bandwidth. Furthermore, the digital signal processing determines the phase of the pilot tone and converts phase deviations to time jitter, which is compensated on the data path afterwards. Disadvantageously, in this context, the pilot signal must have a certain distance to multiples of the half of the clock frequency and therefore reduces the useful bandwidth noticeably. As a further disadvantage, nonlinear effects result in images of the pilot signal within the useful bandwidth.

Accordingly, there is a need to provide a measuring device with jitter compensation, a corresponding calibration method therefor, and a measuring method with jitter compensation, each of which ensures both a high accuracy and an increased efficiency.

SUMMARY OF THE INVENTION

According to a first aspect of the invention, a measuring device with jitter compensation is provided. The measuring device comprises a clock source, and at least one phase shifter. In this context, the at least one phase shifter is configured to receive a clock signal from the clock source and to adjust the respective phase. Advantageously, both a high accuracy and an increased efficiency can be ensured.

According to a first preferred implementation, the clock source is separate from the ADC and outputs a high quality signal with very low phase noise to the ADC and the coupler for the measurement signal. In a signal analyzer, much better (lower phase noise) oscillators can be built than the built-in oscillators of an ADC. This clock signal shows a much lower phase noise (jitter) than the jitter introduced later by the ADC. Thus, existing jitter can be compensated for.

According to a second preferred implementation form of the first aspect of the invention, the measuring device comprises at least one analog-to-digital converter. In addition to this or as an alternative, the measuring device comprises or is a spectrum analyzer. Advantageously, for instance, efficiency can further be increased.

According to a third preferred implementation form of the first aspect of the invention, the measuring device further comprises at least one combiner. In this context, the at least one combiner is configured to introduce the clock source to combine the clock signal and a respective measured signal. Advantageously, for example, accuracy can further be increased.

According to a forth preferred implementation form of the first aspect of the invention, the measuring device further comprises at least one phase shift adjuster for the at least one phase shifter. In this context, the at least one phase shift adjuster is configured to shift the phase of the clock source until it is sampled by the at least one analog-to-digital converter near the respective zero crossing. Advantageously, for instance, inaccuracy can further be reduced.

According to a further preferred implementation form of the first aspect of the invention, the measuring device further comprises at least one lowpass filter, preferably downstream of the at least one analog-to-digital converter. In this context, the at least one lowpass filter is configured to filter out a respective measured signal. Advantageously, complexity can be reduced, thereby increasing efficiency.

According to a further preferred implementation form of the first aspect of the invention, the at least one lowpass filter is further configured to leave only the samples of the respective pilot signal. Advantageously, for instance, accuracy can further be increased.

According to a further preferred implementation form of the first aspect of the invention, the measuring device further comprises at least one pilot signal investigator. In this context, the at least one pilot signal investigator is configured to measure a respective sampled pilot signal and to compare it with the maximum magnitude of a corresponding injected pilot signal. Advantageously, for example, an increased accuracy can be ensured.

According to a further preferred implementation form of the first aspect of the invention, the at least one pilot signal investigator is further configured to calculate jitter, preferably jitter of certain samples, of the at least one analog-to-digital converter on the basis of the comparison of the respective sampled pilot signal with the maximum magnitude of the corresponding injected pilot signal. Advantageously, for instance, not only accuracy but also efficiency can be increased.

According to a further preferred implementation form of the first aspect of the invention, the measuring device further comprises at least one measured signal time adjuster. In this context, the at least one measured signal time adjuster is configured to adjust the corresponding samples of a respective measured signal on the basis of the calculated jitter, preferably the calculated jitter of the certain samples, of the at least one analog-to-digital converter. Advantageously, for instance, inaccuracy can further be reduced.

According to a further preferred implementation form of the first aspect of the invention, the measuring device further comprises at least one real time feedback loop. In this context, the at least one real time feedback loop is configured to provide a respective feedback for the at least one phase shifter to shift the respective phase of the clock source until it is sampled by the at least one analog-to-digital converter near the respective zero crossing in order to compensate for slow changes, preferably a temperature drift. Advantageously, for example, both accuracy and efficiency can further be increased.

According to a further preferred implementation form of the first aspect of the invention, the at least one real time feedback loop comprises an integrator. In this context, the integrator is configured to amplify the corresponding direct current component of the respective signal. Advantageously, for instance, accuracy can further be increased.

According to a further preferred implementation form of the first aspect of the invention, the at least one real time feedback loop comprises a digital-to-analog converter. In this context, the digital-to-analog converter is configured to provide the respective feedback to the at least one phase shifter. Advantageously, for example, inaccuracy can further be reduced.

According to a further preferred implementation form of the first aspect of the invention, the at least one measured signal time adjuster comprises or is a resampler. Advantageously, for instance, efficiency can further be increased.

According to a further preferred implementation form of the first aspect of the invention, the at least one measured signal time adjuster comprises or is a phase shifter. Advantageously, for instance, complexity can further be reduced, which leads to an increased efficiency.

According to a second aspect of the invention, a calibration method for calibrating the measuring device according to the first aspect of the invention is provided. The calibration method comprises the step of sweeping the at least one phase shifter until a maximum magnitude is detected. Advantageously, for instance, a high accuracy can be ensured.

According to a third aspect of the invention, a measuring method with jitter compensation is provided. The measuring method comprises the steps of receiving a clock signal from a clock source with the aid of at least one phase shifter, and adjusting the respective phase with the aid of the at least one phase shifter. Advantageously, both a high accuracy and an increased efficiency can be ensured.

According to a first preferred implementation form of the third aspect of the invention, the measuring method further comprises the step of introducing the clock source to combine the clock signal and a respective measured signal. Advantageously, for example, accuracy can further be increased.

According to a second preferred implementation form of the third aspect of the invention, the measuring method further comprises the step of shifting the phase of the clock source until it is sampled by at least one analog-to-digital converter near the respective zero crossing.

Advantageously, for instance, both accuracy and efficiency can further be increased.

According to a further preferred implementation form of the third aspect of the invention, the measuring method further comprises the steps of measuring a respective sampled pilot signal, and comparing it with the maximum magnitude of a corresponding injected pilot signal. Advantageously, for example, an increased accuracy can be ensured.

According to a further preferred implementation form of the third aspect of the invention, the measuring method further comprises the step of calculating jitter, preferably jitter of certain samples, of at least one analog-to-digital converter on the basis of the comparison of the respective sampled pilot signal with the maximum magnitude of the corresponding injected pilot signal. Advantageously, for instance, not only accuracy but also efficiency can be increased.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
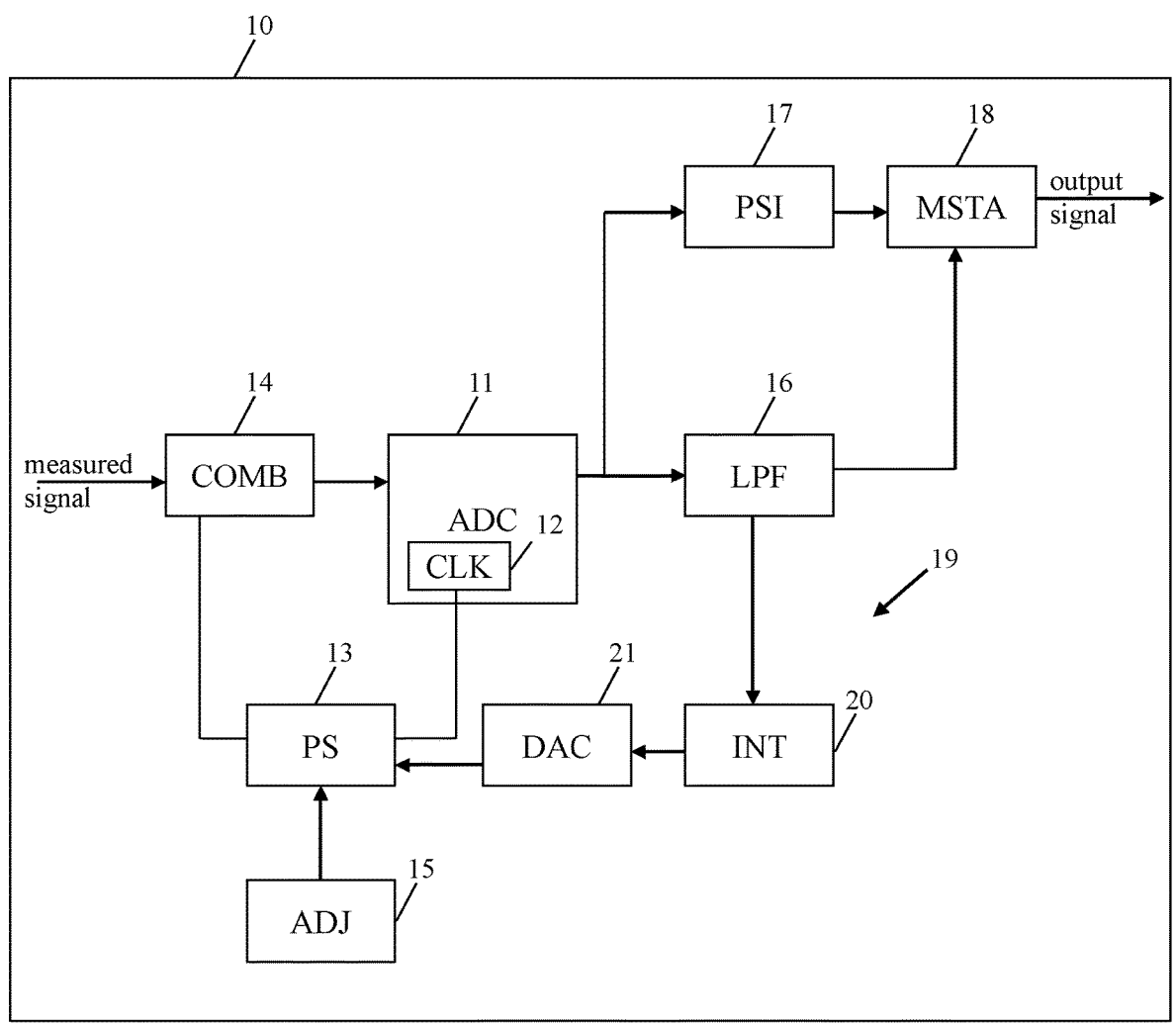
FIG. 1 shows an exemplary embodiment of the first aspect of the invention.

Firstly, FIG. 1 illustrates an exemplary embodiment of the inventive measuring device 10 with jitter compensation. Said measuring device 10 comprises an analog-to-digital converter 11, a clock source 12, and a phase shifter 13. In this context, the phase shifter 13 receives a clock signal from the clock source 12 and adjusts the respective phase.

In addition to this, it is noted that the measuring device 10 may preferably comprise or be a spectrum analyzer.

As it can further be seen from FIG. 1, the measuring device 10 additionally comprises a combiner 14. Said combiner 14 introduces the clock source 12 to combine the clock signal and a respective measured signal.

Moreover, the measuring device 10 further comprises a phase shift adjuster 15 for the phase shifter 13. In this context, said phase shift adjuster 15 shifts the phase of the clock source 12 until it is sampled by the analog-to-digital converter 11 near the respective zero crossing.

Furthermore, in accordance with FIG. 1, the measuring device 10 additionally comprises a lowpass filter 16 downstream of the analog-to-digital converter 11. Said lowpass filter 16 filters out the respective measured signal.

In addition to this, it might be particularly advantageous if the lowpass filter 16 leaves only the samples of the respective pilot signal.

Further additionally, the measuring device 10 comprises a pilot signal investigator 17. In this context, said pilot signal investigator 17 measures a respective sampled pilot signal and compares it with the maximum magnitude of a corresponding injected pilot signal.

It might be particularly advantageous if the pilot signal investigator 17 additionally calculates jitter, preferably jitter of certain samples, of the analog-to-digital converter 11 on the basis of the above-mentioned comparison of the respective sampled pilot signal with the maximum magnitude of the corresponding injected pilot signal.

As it can further be seen from FIG. 1, the measuring device 10 additionally comprises a measured signal time adjuster 18. In this context, said measured signal time adjuster 18 adjusts the corresponding samples of the respective measured signal on the basis of the calculated jitter, preferably the calculated jitter of the certain samples, of the analog-to-digital converter 11.

Furthermore, the measuring device 10 additionally comprises a real time feedback loop 19. In this context, the real time feedback loop 19 provides a respective feedback for the phase shifter 13 to shift the respective phase of the clock source 12 until it is sampled by the analog-to-digital converter 11 near the respective zero crossing in order to compensate for slow changes such as a temperature drift.

In accordance with FIG. 1, the above-mentioned real time feedback loop 19 comprises an integrator 20. Said integrator 20 amplifies the corresponding direct current component of the respective signal.

In addition to this, the real time feedback loop 19 further comprises a digital-to-analog converter 21. In this context, the digital-to-analog converter 21 provides the respective feedback to the phase shifter 13.

With respect to the above-mentioned measured signal time adjuster 18 of the measuring device 10, it is noted that it might be particularly advantageous if said measured signal time adjuster 18 comprises or is a resampler.

In addition to this or as an alternative the above-above-mentioned measured signal time adjuster 18 may preferably comprise or be a phase shifter.

Figure 2:
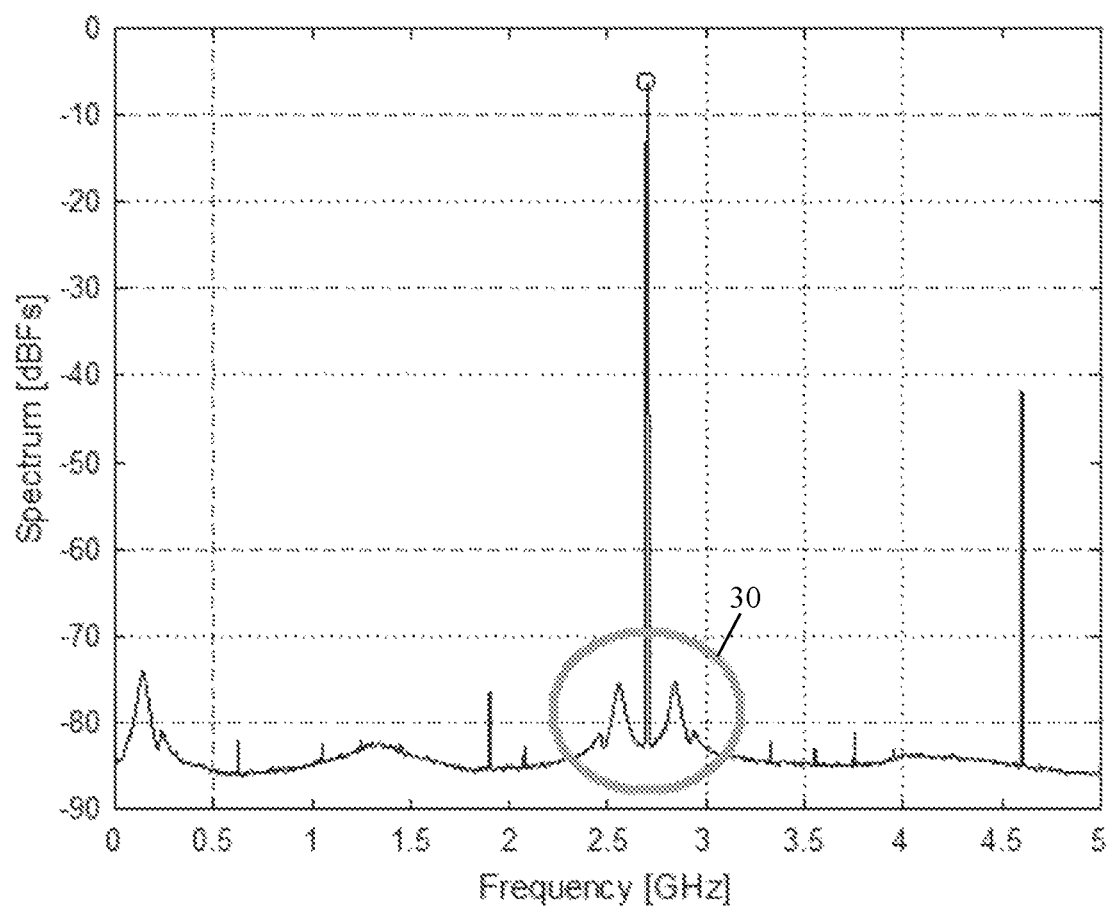
FIG. 2 shows exemplary jitter side lobes on a 2.7 GHz carrier.

Now, with respect to FIG. 2, exemplary jitter side lobes on a 2.7 GHz carrier are illustrated, which are marked with the aid of the depicted circle 30.

In this context, it should be generally mentioned that broadband signal analyzers need high speed analog-to-digital converters to capture the input signal $s_{in}$. For instance, to capture a single channel with 4 GHz bandwidth on an intermediate frequency, the analog-to-digital converter should use a sampling clock of about 10 GHz in this example. An ideal analog-to-digital converter with a sampling frequency $f_{clk}$ outputs exactly equidistant samples $$s_{out}(k) = s_{in}(k \cdot T) \tag{1}$$

with $$T = \frac{1}{f_{clk}}. \tag{2}$$

However, a real world analog-to-digital converter introduces jitter to the output samples according to the following formula:

$$s_{out}(k) = s_{in}(k \cdot T + \tau(k)). \tag{3}$$

This jitter is visible as the unwanted side lobes of data carriers according to FIG. 2 and will degrade the results of modulation analysis, for example, for orthogonal frequency-division multiplexing (OFDM) signals. Exemplarily, in accordance with FIG. 2, it has been sampled with a 10 GHz analog-to-digital converter.

Now, with general respect to the present invention, it is noted that the clock source of the analog-to-digital converter may advantageously be used as pilot tone. Using the clock source itself as pilot signal does especially not add additional spurious signals preferably in the digital domain.

It is further noted that the reduction of the respective useful bandwidth is inventively minimized especially since the respective pilot tone and its corresponding image fall together to direct current in the digital domain. Additionally, it should be mentioned that despite the fact that there is no phase information available from this direct current signal, jitter can inventively be compensated.

Figure 3:
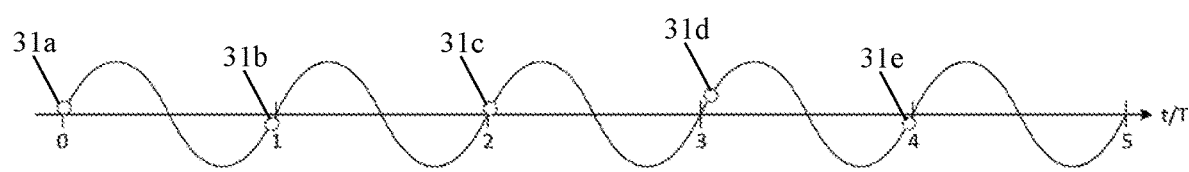
FIG. 3 shows an exemplary sampling of a analog-to-digital converter clock pilot signal.

In this context, FIG. 3 shows an exemplary sampling of the respective pilot tone. The depicted circles 31a, 31b, 31c, 31d, 31e exemplarily mark the jittered sample points.

Figure 4:
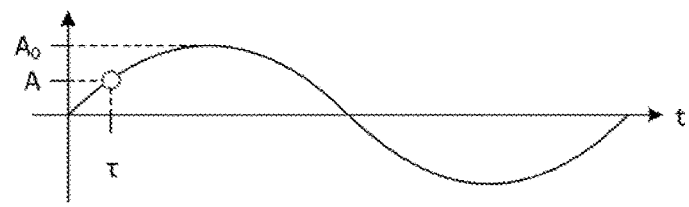
FIG. 4 shows an exemplary conversion of magnitude into jitter.

In accordance with FIG. 4, if the amplitude $A_0$ of the pilot tone is known, the jitter $\tau$ can be calculated from the magnitude A of the respective sample.

Moreover, for small $\tau$ and sampling at the respective zero crossing of the pilot, the following formula applies:

$$A = A_0 \cdot \sin(2\pi \cdot f_{clk} \cdot \tau) \approx A_0 \cdot 2\pi \cdot f_{clk} \cdot \tau \tag{4}$$

with $$\tau \approx \frac{A}{A_0 \cdot 2\pi \cdot f_{clk}}. \tag{5}$$

It is noted that sampling at the zero crossings is especially ensured if the mean value of the sampled pilot signal is zero. Since the slope of the sine signal is maximized at the zero crossings, also the sensitivity of the jitter detection is maximized at these points.

Now, with respect to the structures according to FIG. 5, FIG. 6, FIG. 7, and FIG. 8, it should be mentioned that for the sake of shortness and lucidity, parts or components having already been explained are not explicitly elucidated again in the following.

Figure 5:
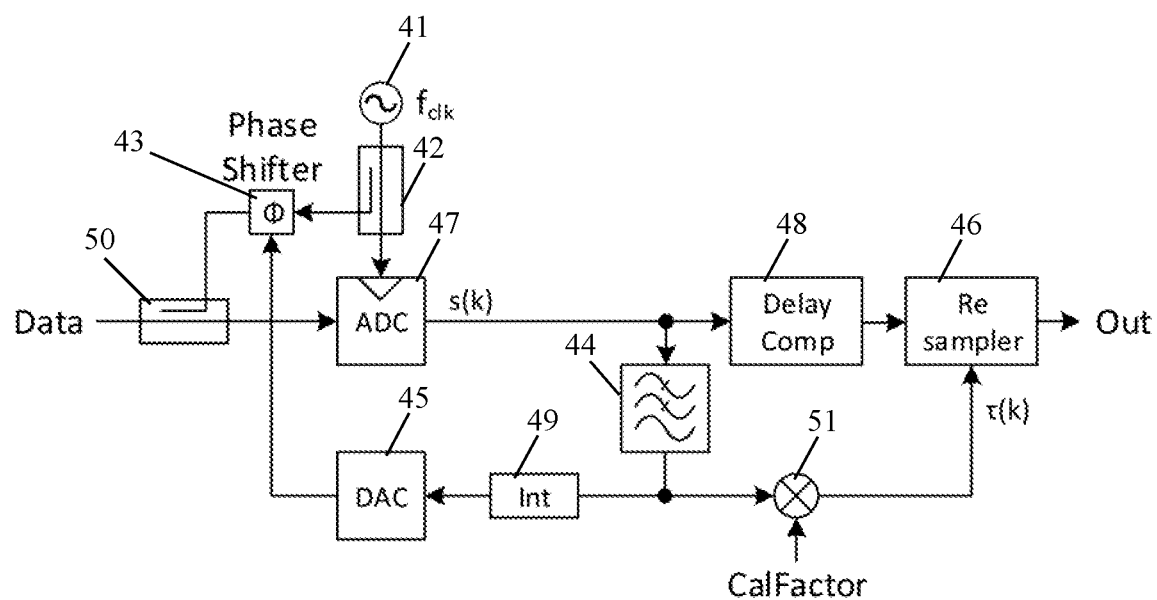
FIG. 5 shows an exemplary inventive aperture jitter compensator with resampler.

FIG. 5 illustrates an inventive aperture jitter compensator with resampler. In this context, the analog-to-digital converter sample clock 41 is added to the analog-to-digital converter input by a coupler 42. A phase shifter 43 allows to adjust the phase of the pilot signal until it is sampled at its zero crossing. The control signal for the phase shifter 43 is preferably calculated in the digital domain.

Furthermore, the synchronous sampling of the pilot tone especially results in a voltage that corresponds to the deviation of the sample clock 41 from the ideal sample clock. The constant part of this voltage is a measure for the phase offset between the pilot signal and the sample clock 41. This signal is later used to adjust the phase shifter 43 via a control loop. The variable part of this voltage is a measure for the clock jitter and can be used to compensate for the jitter in the digital domain.

Moreover, the lowpass filter 44 separates the pilot signal from the actual data signal, which lies on an intermediate frequency. The lowpass cutoff frequency is typically 0.1 of the analog-to-digital converter sampling frequency. The pilot signal is integrated and controls the phase shifter 43 via a digital-to-analog converter 45. This control loop especially ensures a mean value of zero on the sampled pilot and therefore a sampling on the zero crossings. Advantageously, the control loop has to follow only very slow changes like temperature effects.

It is further noted that with the aid of a multiplier 51, the lowpass filtered pilot signal is multiplied by a factor "Cal-Factor" according to the following formula:

$$CalFactor = \frac{1}{A_0 \cdot 2\pi \cdot f_{clk}}. \tag{6}$$

Said factor converts the amplitude information into jitter timing $\tau(k)$. The jitter timing is compensated on the data path by a fractional resampler 46, preferably a polyphase filter. A delay compensation on the data path especially compensates for the group delay of the lowpass filter 44.

Furthermore, it is noted that the analog-to-digital converter 47 of FIG. 5 may preferably be equivalent to the analog-to-digital converter 11 according to FIG. 1, whereas the delay comparator 48 of FIG. 5 may preferably be equivalent to the pilot signal investigator 17 depicted in FIG. 1. In addition to this, the integrator 49 according to FIG. 5 may preferably be equivalent to the integrator 20 of FIG. 1, whereas the coupler 50 of FIG. 5 may preferably be equivalent to the combiner 14 according to FIG. 1.

Figure 6:
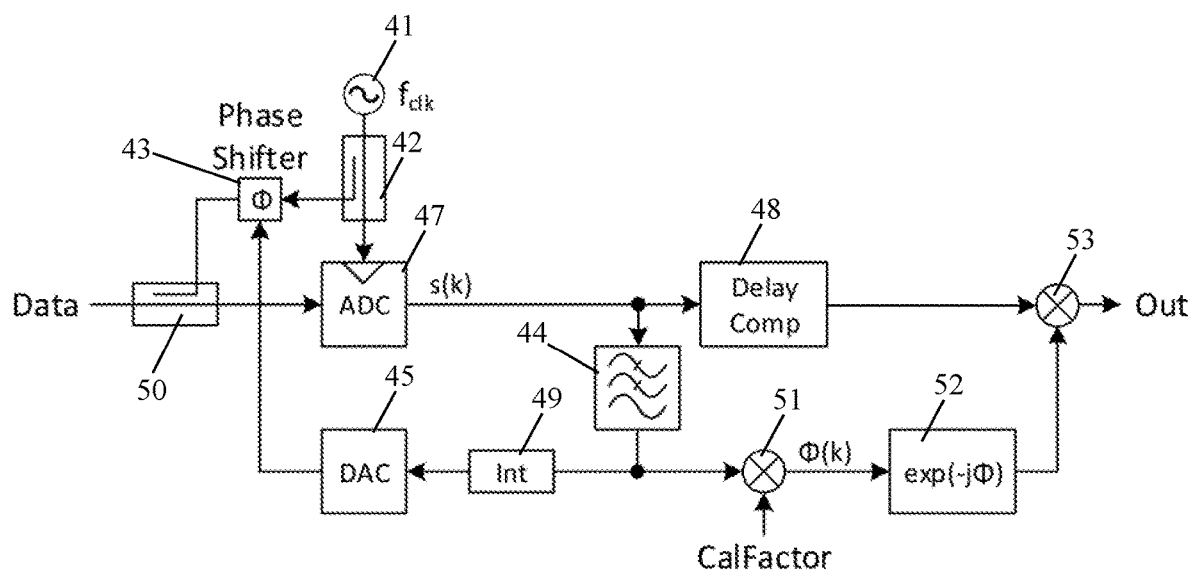
FIG. 6 shows an exemplary inventive aperture jitter compensator with phase correction.

Now, with respect to FIG. 6, an inventive aperture jitter compensator with phase correction is depicted. Due to the fact that a resampler, especially a polyphase resampler, according to FIG. 5 may be a quite expensive module in digital hardware, the inventive structure according to FIG. 6 dispenses with such a resampler.

In particular, if only a small fraction of the available bandwidth has to be corrected, a phase correction according to FIG. 6 can advantageously be sufficient. In this context, a timing jitter of $\tau(k)$ results in a phase jitter of $$\Phi(k) = 2\pi \cdot \tau(k) \cdot f_0 \qquad (7)$$

on a carrier situated at $f_0$. Using the implementation of FIG. 6, the factor "CalFactor" is especially set to $$CalFactor = \frac{f_0}{A_0 \cdot f_{clk}}. \qquad (8)$$

In accordance with FIG. 6, a complex multiplication with $\exp(-j\Phi)$ especially compensates for the phase on the respective data signal.

With respect to both the jitter compensator according to FIG. 5 and the jitter compensator according to FIG. 6, it is noted that the magnitude $A_0$ of the in-coupled clock signal is especially needed to convert the actual magnitude into time jitter.

Figure 7:
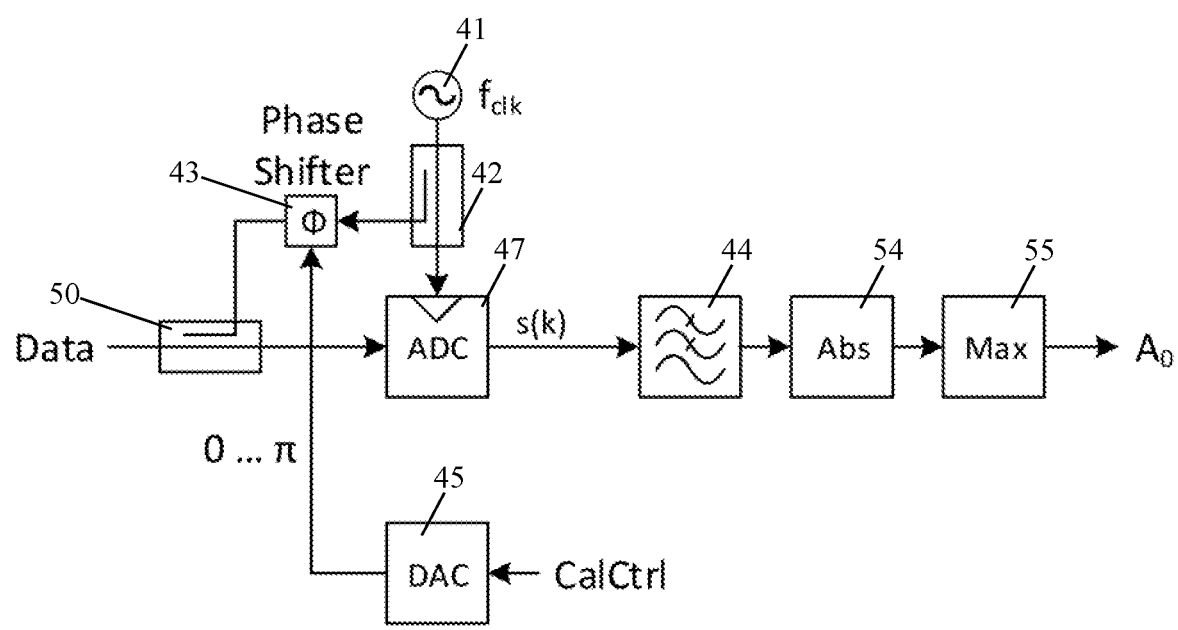
FIG. 7 shows an exemplary inventive tuning of the phase shifter.

For calibrating the inventive jitter compensator or the inventive measuring device, respectively, the phase shifter may preferably be tuned in accordance with FIG. 7.

In this context, the phase shifter 43 is exemplarily swept over the range of 0 to $\pi$ by the "CalCtrl" signal. In addition to this, a detector captures the maximum absolute magnitude of the signal, which equals $A_0$.

Figure 8:
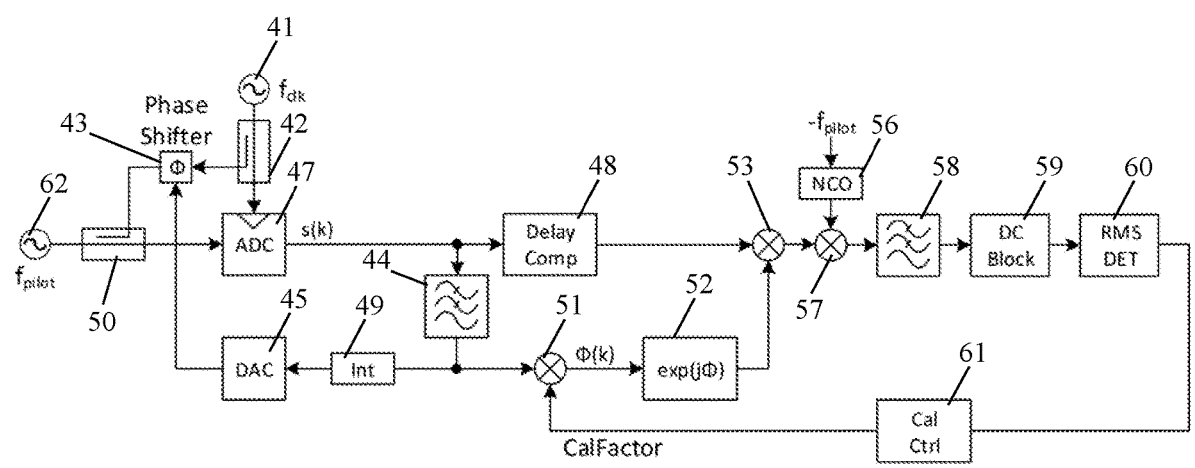
FIG. 8 shows an exemplary inventive calibration control loop.

As an alternative, the inventive jitter compensator or the inventive measuring device, respectively, may be indirectly calibrated with the aid of a pilot carrier according to FIG. 8.

In this context, a pilot signal with the known frequency $f_{pilot}$ is sampled. The jitter compensator runs according to FIG. 5 or FIG. 6, respectively. The pilot signal is mixed to direct current especially with the aid of a mixer 57 and a numerically controlled oscillator 56 and filtered by a lowpass filter 58. Furthermore, a direct current blocker 59 removes any constant offset. In addition to this, the remaining noise power is detected by a root mean square detector 60.

Moreover, a calibration control module 61 especially sets the factor "CalFactor" in a way that the noise power output of the root mean square detector 60 is minimized.

Figure 9:
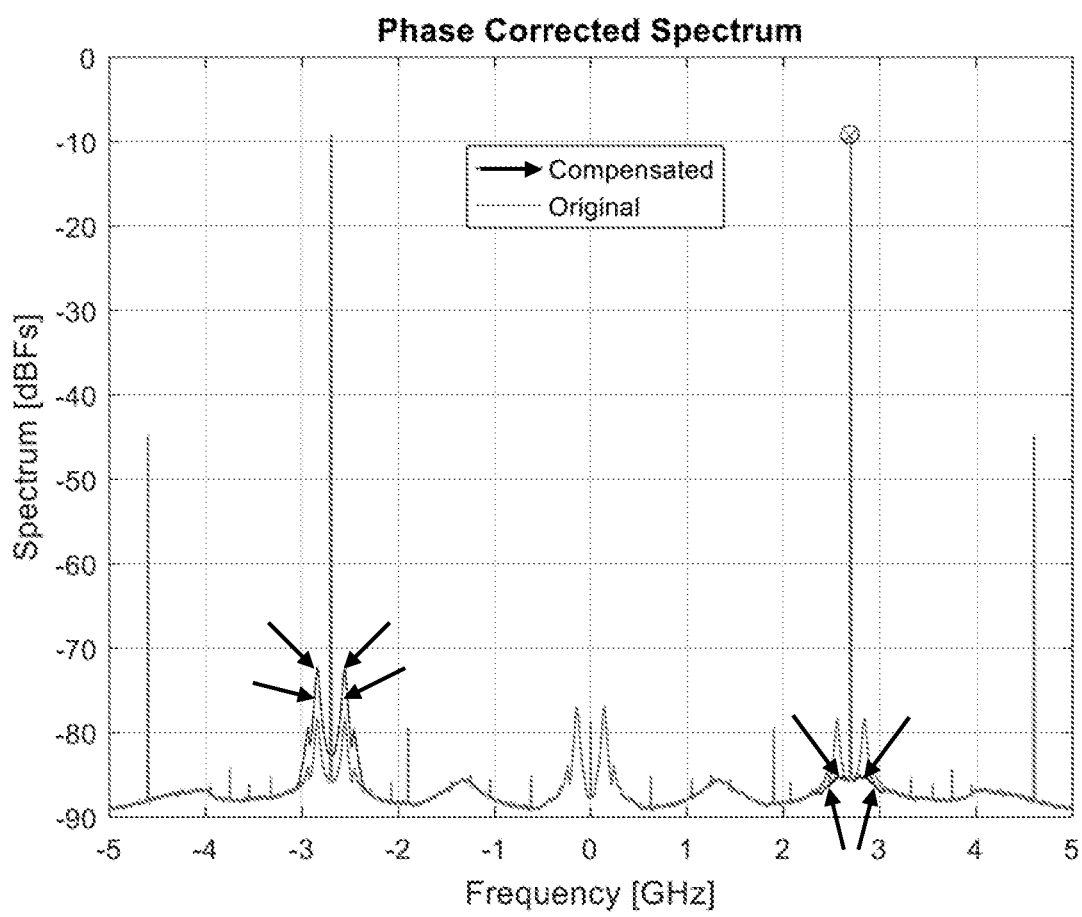
FIG. 9 shows an exemplary spectrum before and after inventive jitter compensation.

Now, with respect to FIG. 9, an exemplary spectrum before and after the inventive jitter compensation is depicted. In this context, the jitter compensation has exemplarily been tested with an analog-to-digital converter with a sample clock of 10 GHz and a test data tone at 2.7 GHz. Whereas the inventive aperture jitter compensator with phase correction according to FIG. 6 has exemplarily been applied, FIG. 9 especially illustrates the suppression of the jitter introduced side lobes around the data tone.

Figure 10:
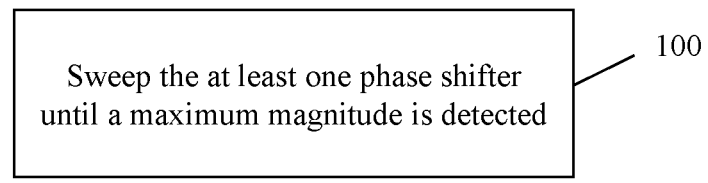
FIG. 10 shows a flow chart of an exemplary embodiment of the second aspect of the invention.

Furthermore, FIG. 10 shows a flow chart of an exemplary embodiment of the inventive calibration method for calibrating the measuring device according to the first aspect of the invention. In this context, in step 100, the at least one phase shifter is swept until a maximum magnitude is detected.

Figure 11:
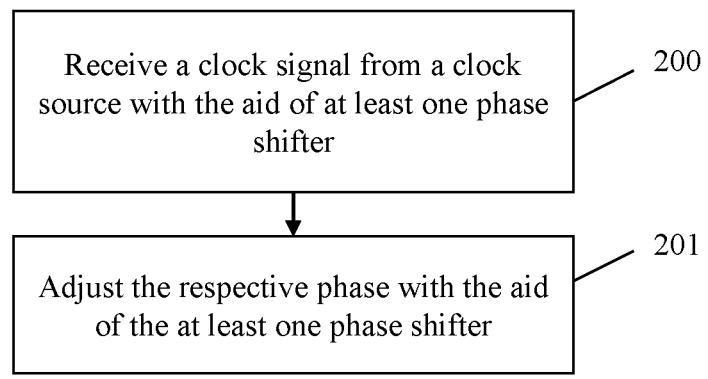
FIG. 11 shows a flow chart of an exemplary embodiment of the third aspect of the invention.

Moreover, FIG. 11 shows a flow chart of an exemplary embodiment of the inventive measuring method with jitter compensation. In a first step 200, a clock signal is received from a clock source with the aid of at least one phase shifter. Then, in a second step 201, the respective phase is adjusted with the aid of the at least one phase shifter.

In this context, it is noted that the foregoing steps may especially be performed with the aid of a measuring device, preferably comprising or being a spectrum analyzer. In addition to this or as an alternative, the measuring device may preferably comprise at least one analog-to-digital converter.

It is additionally noted that especially for calibrating said measuring device, the step of sweeping the at least one phase shifter until a maximum magnitude is detected may preferably be performed.

Moreover, the measuring method may further comprise the step of introducing the clock source to combine the clock signal and a respective measured signal. Said step may preferably be performed with the aid of a combiner especially comprised by measuring device.

It might be particularly advantageous if the measuring method further comprises the step of shifting the phase of the clock source until it is sampled by the at least one analog-to-digital converter near the respective zero crossing. Said step may preferably be performed with the aid of a phase shift adjuster especially provided for the at least one phase shifter.

Furthermore, the measuring method may further comprise the step of filtering out a respective measured signal. Said step may especially be performed with the aid of a lowpass filter, preferably a lowpass filter downstream of the at least one analog-to-digital converter.

In addition to this, the measuring method may preferably comprise the step of leaving only the samples of the respective pilot signal. This step may especially be performed with the aid of said lowpass filter.

It is further noted that the measuring method may further comprise the steps of measuring a respective sampled pilot signal and comparing it with the maximum magnitude of a corresponding injected pilot signal. Said steps may preferably be performed with the aid of a pilot signal investigator especially comprised by the measuring device.

Additionally, the measuring method may especially comprise the step of calculating jitter, preferably jitter of certain samples, of the at least one analog-to-digital converter on the basis of the comparison of the respective sampled pilot signal with the maximum magnitude of the corresponding injected pilot signal. This step may preferably be performed with the aid of said pilot signal investigator.

In further addition to this, the measuring method may further comprise the step of adjusting the corresponding samples of a respective measured signal on the basis of the calculated jitter, preferably the calculated jitter of the certain samples, of the at least one analog-to-digital converter. Said step may preferably be performed with the aid of a measured signal time adjuster especially comprised by the measuring device.

It might be particularly advantageous if the measuring method further comprises the step of providing a respective feedback for the at least one phase shifter to shift the respective phase of the clock source until it is sampled by the at least one analog-to-digital converter near the respective zero crossing in order to compensate for slow changes, preferably a temperature drift. Said step may preferably be performed with the aid of a real time feedback loop especially comprised by the measuring device.

In addition to this, the measuring method may preferably comprise the step of amplifying the corresponding direct current component of the respective signal. Said step may preferably be performed with the aid of an integrator especially comprised by the above-mentioned real time feedback loop.

Further additionally, the measuring method may preferably comprise the step of providing the respective feedback to the at least one phase shifter. This step may preferably be performed with the aid of a digital-to-analog converter especially comprised by said real time feedback loop.

With respect to the above-above-mentioned measured signal time adjuster, it is noted that said measured signal time adjuster may preferably comprise a resampler.

In addition to this or as an alternative, it might be particularly advantageous if the measured signal time adjuster comprises a phase shifter.

Figure 12:
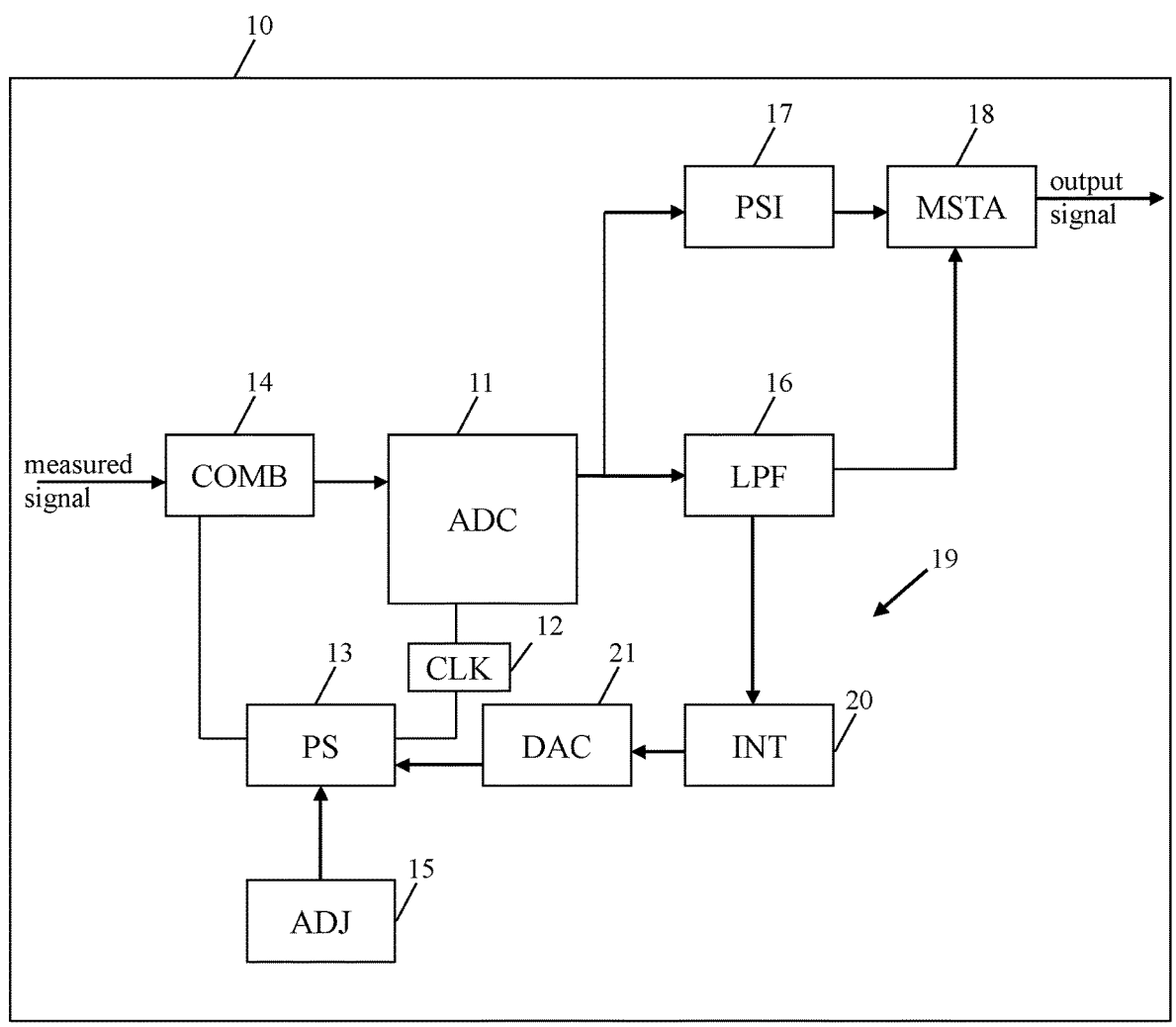
FIG. 12 shows a further exemplary embodiment of the first aspect of the invention.

Finally, FIG. 12 depicts a further exemplary embodiment of the first aspect of the invention. Said exemplary embodiment is equivalent to the one according to FIG. 1 with the difference that the clock source 12 is separate from the ADC 11 and outputs a high quality signal with very low phase noise to the ADC 11 and the coupler 14 for the measurement signal. Preferably, with respect to the coupler 14, the clock source 12 outputs said high quality signal especially via the phase shifter 13 to the coupler 14.

In a signal analyzer, much better (lower phase noise) oscillators can be built than the built-in oscillators of an ADC. This clock signal shows a much lower phase noise (jitter) than the jitter introduced later by the ADC. Thus, existing jitter can be compensated for.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of serveral implementations, such feature may be combined with one or more other features of the other implementations as may be desired and advantageous for any given or particular application.

What is claimed is:

1. A measuring device with jitter compensation, the measuring device comprising:
   a clock source, and
   at least one phase shifter,
   wherein the at least one phase shifter is configured to receive a clock signal from the clock source and to adjust the respective phase of the clock source.

2. The measuring device according to claim 1,
   wherein the measuring device comprises at least one analog-to-digital converter, and/or
   wherein the measuring device comprises or is a spectrum analyzer.

3. The measuring device according to claim 1,
   wherein the measuring device further comprises at least one combiner,
   wherein the at least one combiner is configured to introduce the clock source to combine the clock signal and a respective measured signal.

4. The measuring device according to claim 2,
   wherein the measuring device further comprises at least one phase shift adjuster for the at least one phase shifter,
   wherein the at least one phase shift adjuster is configured to shift the phase of the clock source until it is sampled by the at least one analog-to-digital converter near the respective zero crossing.

5. The measuring device according to claim 2,
   wherein the measuring device further comprises at least one lowpass filter downstream of the at least one analog-to-digital converter,
   wherein the at least one lowpass filter is configured to filter out a respective measured signal.

6. The measuring device according to claim 5,
   wherein the at least one lowpass filter is further configured to leave only the samples of the respective pilot signal.

7. The measuring device according to claim 2,
   wherein the measuring device further comprises at least one pilot signal investigator,
   wherein the at least one pilot signal investigator is configured to measure a respective sampled pilot signal and to compare it with the maximum magnitude of a corresponding injected pilot signal.

8. The measuring device according to claim 7,
   wherein the at least one pilot signal investigator is further configured to calculate jitter of certain samples, of the at least one analog-to-digital converter on the basis of the comparison of the respective sampled pilot signal with the maximum magnitude of the corresponding injected pilot signal.

9. The measuring device according to claim 8,
   wherein the measuring device further comprises at least one measured signal time adjuster,
   wherein the at least one measured signal time adjuster is configured to adjust the corresponding samples of a respective measured signal on the basis of the calculated jitter of the certain samples, of the at least one analog-to-digital converter.

10. The measuring device according to claim 2,
    wherein the measuring device further comprises at least one real time feedback loop,
    wherein the at least one real time feedback loop is configured to provide a respective feedback for the at least one phase shifter to shift the respective phase of the clock source until it is sampled by the at least one analog-to-digital converter near the respective zero crossing in order to compensate for slow changes including a temperature drift.

11. The measuring device according to claim 10,
    wherein the at least one real time feedback loop comprises an integrator, wherein the integrator is configured to amplify the corresponding direct current component of the respective signal.

12. The measuring device according to claim 10, wherein the at least one real time feedback loop comprises a digital-to-analog converter,
wherein the digital-to-analog converter is configured to provide the respective feedback to the at least one phase shifter.

13. The measuring device according to claim 9, wherein the at least one measured signal time adjuster comprises a resampler.

14. The measuring device according to claim 9, wherein the at least one measured signal time adjuster comprises a phase shifter.

15. A measuring method with jitter compensation, the measuring method comprising the steps of:
receiving a clock signal from a clock source with the aid of at least one phase shifter, and
adjusting the respective phase of the clock source with the aid of the at least one phase shifter.

16. The method according to claim 15, further comprising the step of:
sweeping the at least one phase shifter until a maximum magnitude is detected.

17. The measuring method according to claim 15, wherein the measuring method further comprises the step of introducing the clock source to combine the clock signal and a respective measured signal.

18. The measuring method according to claim 15, wherein the measuring method further comprises the step of shifting the phase of the clock source until it is sampled by at least one analog-to-digital converter near the respective zero crossing.

19. The measuring method according to claim 15, wherein the measuring method further comprises the steps of:
measuring a respective sampled pilot signal, and
comparing it with the maximum magnitude of a corresponding injected pilot signal.

20. The measuring method according to claim 19, wherein the measuring method further comprises the step of calculating jitter of certain samples, of at least one analog-to-digital converter on the basis of the comparison of the respective sampled pilot signal with the maximum magnitude of the corresponding injected pilot signal.

* * * * *